(12) United States Patent
Matsuhashi

(10) Patent No.: US 6,413,810 B1
(45) Date of Patent: *Jul. 2, 2002

(54) FABRICATION METHOD OF A DUAL-GATE CMOSFET

(75) Inventor: Hideaki Matsuhashi, Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/524,268

(22) Filed: Mar. 13, 2000

(30) Foreign Application Priority Data

Apr. 22, 1999 (JP) ............................................ 11-114316

(51) Int. Cl.[7] ..................... H01L 21/8238; H01L 21/336
(52) U.S. Cl. ..................... 438/231; 438/232; 438/305
(58) Field of Search .............................. 438/231, 232, 438/286, 305, 306, 142

(56) References Cited

U.S. PATENT DOCUMENTS

| | | | |
|---|---|---|---|
| 5,618,748 A | * | 4/1997 | Segawa et al. ............. 438/232 |
| 5,956,591 A | * | 9/1999 | Fulford ....................... 438/305 |
| 6,051,459 A | * | 4/2000 | Gardner et al. ............. 438/231 |
| 6,051,471 A | * | 4/2000 | Gardner et al. ............. 438/286 |

OTHER PUBLICATIONS

K.F. Lee et al., "Room Temperature 0.1 um CMOS Technology with 11.8 ps Gate Delay", 1993 IEEE, IEDM 93-131-134.

* cited by examiner

*Primary Examiner*—Richard Elms
*Assistant Examiner*—Adam J. Pyonin
(74) *Attorney, Agent, or Firm*—Volentine Francos, PLLC

(57) ABSTRACT

A fabrication method for fabricating a dual-gate CMOSFET on a semiconductor substrate according to the present invention includes: implanting ions of N-type impurity for forming a deep junction source and drain in a first region on the semiconductor substrate where an NMOSFET is to be formed; performing a first annealing process for activating the N-type impurity; implanting ions of P-type impurity for forming a deep junction source and drain in a second region on the semiconductor substrate where a PMOSFET is to be formed; and performing a second annealing process for activating the P-type impurity. By performing the above processes in that order, the N-type impurity ions in the N+ polysilicon gate electrode of the NMOSFET are sufficiently activated, thus preventing the problem of depletion. Also, fluctuation of a threshold voltage because of penetration of the P-type impurity ions in the gate electrode of the PMOSFET can be prevented in the PMOSFET.

4 Claims, 5 Drawing Sheets

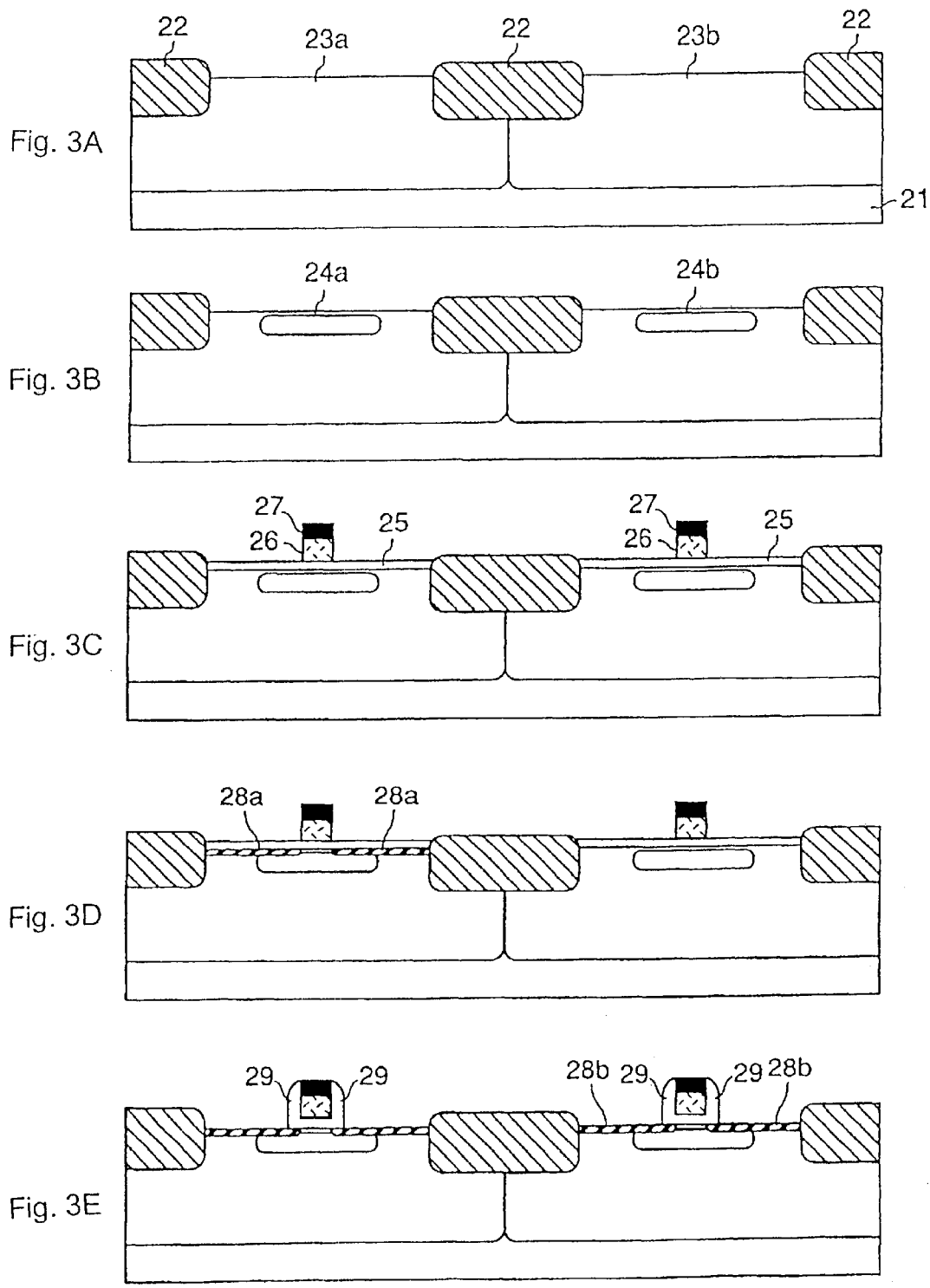

FABRICATION METHOD OF A DUAL-GATE CMOSFET

BACKGROUND OF THE INVENTION

1. Field of the Invention

The present invention relates to a fabrication method of a high-speed dual-gate CMOSFET with high reliability.

2. Description of the Related Art

Recently, the fineness of the gate length of a MOSFET has been reduced to approximately 0.1 µm, as large-scale integrated circuits have become highly integrated. The finer gate length increases a transconductance (gm), resulting in a shorter delay time. Consequently, a MOSFET can operate at a higher speed.

In order to make a normally operating MOSFET having a fine gate, and in particular, a PMOSFET, it is important to suppress a short channel effect. For a PMOSFET having a fine gate, a surface channel (SC) type MOSFET including a gate electrode of $P^+$ polysilicon has become common, rather than a buried channel (BC) type MOSFET including a gate electrode of $N^+$ polysilicon, which was widely used conventionally.

A CMOSFET in which an $N^+$ polysilicon gate electrode is used an NMOSFET while a $P^+$ polysilicon gate electrode is used in PMOSFET is called a dual-gate CMOSFET.

An exemplary fabrication method of the dual-gate CMOSFET is described by K. F. Lee et al., in "IEDM Tech. Dig." (1993), p. 131. FIGS. 1A–1E and 2F–2H are diagrams schematically showing processes of this method. In FIGS. 1A–1E and 2F–2H the NMOSFET is shown the left side while the PMOSFET is shown on the right side.

In accordance with this method, a recessed LOCOS (Local Oxidation of Silicon) film 122 of 750 nm thickness is formed on a silicon substrate 121 using a known technique. A P well 123a and an N well 123b are then formed using a high-energy ion implantation apparatus. In this example, the P well 123a is formed by implanting boron (B) of $1 \geq 10^{13}$ cm$^{-2}$ with 400 keV, and the N well 123b is formed by implanting phosphorus (P) of $1 \geq 10^{13}$ cm$^{-2}$ with 900 keV (FIG. 1A).

Next, a resist pattern is formed (not shown), to be used as a mask for defining an ion implantation region. Using the resist pattern as the mask, punchthrough suppression implantation for suppressing the short channel effect, and channel implantation for controlling a threshold voltage are performed by ion, implantation, only in regions 124a, 124b that are to be positioned under gates.

For example, the punchthrough suppression-implantation and the channel implantation for the P well are performed in the region 124a by implanting boron of $4 \geq 10^{12}$ cm$^{-2}$ with 45 keV and boron fluoride ($BF_2$) of $1 \geq 10^{13}$ cm$^{-2}$ with 90 keV.

On the other hand, the punchthrough suppression implantation and channel implantation for the N well are performed in the region 124b by implanting phosphorus (P) of $4 \geq 10^{12}$ cm$^{-2}$ with 120 keV and arsenic (As) of $1 \geq 10^{13}$ cm$^{-2}$ with 100 keV (FIG. 1B).

A gate oxidation film 125 is then formed with a thickness of 4 nm, in a furnace at 800° C. On the gate oxidation film 125, a polysilicon film 126 having a thickness of 200 nm and a silicon nitride film 127 having a thickness of 100 nm are deposited by LPCVD, and thereafter a resist pattern (not shown) to be used as a mask for patterning gate electrodes is formed.

Using the resist pattern as the mask, unnecessary portions of the polysilicon film 126 and the silicon nitride film 127 are etched away, thus forming polysilicon gate electrodes 126, each having a gate length of about 0.1 µm (FIG. 1C).

Next, a resist is formed (not shown), for preventing ion implantation into undesired portions. Using the thus formed resist pattern as the mask, As of $5 \times 10^{14}$ cm$^{-2}$ is introduced by ion implantation at 10 keV to form a shallow junction source and drain of the NMOSFET (shallow junction S/D) 128a (FIG. 1D).

After an $SiO_2$ film having a thickness of 50 nm is deposited using TEOS by CVD, the $SiO_2$ film is etched back by reactive ion etching (RIE) to form first side walls 129. A resist pattern (not shown) for preventing ion implantation into undesired portions is then formed. Using the resist pattern, $BF_2$ of $1 \geq 10^{15}$ cm$^{-2}$ is introduced with 10 keV to form a shallow junction source and drain 128b of the PMOSFET (FIG. 1E).

Next, $SiO_2$ film having a thickness of 200 nm is deposited again using TEOS by CVD, following which the $SiO_2$ film is etched back by reactive ion etching (RIE), to form second side walls 130 (FIG. 2F).

Then, deep junction S/Ds 131a, 131b are formed by ion implantation. The deep junction source and drain 131a of the NMOSFET are formed by implanting As of about $5 \geq 10^{15}$ cm$^{-2}$ with 20 keV while the deep junction source and drain 131b of the PMOSFET are formed by implanting $BF_2$ of about $5 \geq 10^{15}$ cm$^{-2}$ with 10 keV.

Simultaneously, impurities such as As or $BF_2$, are also introduced into the polysilicon gate electrodes 126. More specifically, As is introduced into the gate electrode of the NMOSFET so that an $N^+$ polysilicon gate electrode 126a is obtained. On the other hand, $BF_2$ is introduced into the gate electrode of the PMOSFET so that a $P^+$ polysilicon gate electrode 126b is obtained (FIG. 2G).

Annealing is then performed for 10 seconds at 1050° C. by a rapid annealing apparatus (RTA) and then drive-in is performed in a typical electric furnace at 800° C. for 20 minutes, thus producing a dual-gate CMOSFET having a fine gate length (FIG. 2H).

As mentioned above, the CMOSFET which includes an NMOSFET having an $N^+$ polysilicon gate electrode, and a PMOSFET having a $P^+$ polysilicon gate electrode is fabricated by introducing the same impurities into the gate electrodes as those introduced into the source and the drains during the S/D ion implantation. The CMOSFET thus fabricated can withstand the short channel effect, operate at a high speed and have a high reliability.

The thus fabricated CMOSFET, however, has a problem where the threshold voltage may vary because of penetration of boron (B) included in $P^+$ polysilicon, into the channel region, through the gate oxidation film during the annealing process.

In order to avoid penetration of boron (B), the following three methods can be considered.

(1) Only boron is used as the impurity introduced into the source and the drain.

(2) The annealing process is performed at a lower temperature.

(3) A film to which nitrogen (N) is added is used as the gate oxidation film.

Regarding method (1), the penetration of boron (B) frequently occurs when boron fluoride ($BF_2$) is implanted into the gate electrode. In other words, when just boron is implanted, penetration of boron does not occur as long as the temperature is kept relatively low or the concentration of boron is kept low. Therefore, it can be considered that boron is introduced by boron implantation. In this case, however, the junction of the S/D becomes deeper when boron is implanted into both the source and the drain simultaneously because boron is a light element. This makes the resultant MOSFET inappropriate for a MOSFET having a fine gate length.

Implantation with an energy level of 1 keV or less or implantation using decaborane ($B_{10}H_{16}$), which is a heavy element including no fluorine (F), has recently attracted attention. Such implantation, however, requires a special ion implantation apparatus, thus increasing the fabrication cost. In addition, it is difficult to immediately apply such implantation to the fabrication process because the development of such implantation technology is relatively recent.

Regarding method (2), even if boron fluoride ($BF_2$) is used, the penetration of boron through the gate oxidation film does not cause fluctuation of the threshold voltage, as long as the annealing process is performed at a relatively low temperature and for a short time period. According to the experiments by the inventors of the present invention, in a case of the gate oxidation film having a thickness of 35 angstroms, the threshold voltage fluctuated when the annealing process was performed at 1050° C. for 10 seconds, whereas it did not fluctuate when the annealing process was performed at 1000° C. for 10 seconds.

However, when the temperature of the annealing process is decreased from 1050° C. to 1000° C., depletion occurs in the $N^+$ polysilicon gate electrode. This results in a decrease of the transconductance (gm) and the ON current of the NMOSFET by about 10%.

Regarding method (3), in a case of using oxidized nitride film, which is a gate oxidation film with nitrogen added thereto, no fluctuation of the threshold voltage due to penetration of boron through the gate oxidation film occurs, even if $BF_2$ is used. However, it is known that the addition of nitrogen (N) causes generation of fixed charges and an interface state at the interface between silicon and the gate oxidation film including nitrogen, resulting in fluctuation of the threshold voltage and decrease of transconductance.

It is reported that the problems of the fixed charges and the interface state can be improved by improving the method for adding nitrogen. However, the gate oxidation film including nitrogen is inferior to the gate oxidation film formed by thermal oxidation.

As described above, methods (1) to (3) are unable to provide a fabrication method of a dual-gate CMOSFET capable of fabricating a dual-gate CMOSFET having the desired performance at a low cost.

SUMMARY OF THE INVENTION

Therefore, it is an object of the present invention to provide a fabrication method which enables easy fabrication of a dual-gate CMOSFET, having a satisfactory performance with high precision at a cost appropriate for industrial mass-production.

In order to achieve the above object, a fabrication method for fabricating a dual-gate CMOSFET on a semiconductor substrate according to the present invention, includes: implanting ions of N-type impurity for forming a deep junction source and drain in a first region on the semiconductor substrate where an NMOSFET is to be formed; performing a first annealing process for activating the N-type impurity; implanting ions of P-type impurity for forming a deep junction source and drain in a second region on the semiconductor substrate where a PMOSFET is to be formed; and performing a second annealing process for activating the P-type impurity.

In one embodiment of the present invention, the first annealing process is performed using a rapid anneal apparatus at a temperature of 1050° C. or higher.

In another embodiment of the present invention, the second annealing process is performed using a rapid anneal apparatus at a temperature of 1000° C. or lower.

Thus, in accordance with the fabrication method for fabricating the CMOSFET of the present invention, the annealing process for activation is performed at a high temperature of 1050° C. or higher, after ion implantation, to form the deep junction S/D of the NMOSFET, and thereafter the annealing process for activation is performed at a low temperature of 1000° C. or lower, after ion implantation, to form the deep junction S/D of the PMOSFET. Therefore, As in the gate electrode of $N^+$ polysilicon of the NMOSFET is activated sufficiently, thus preventing, the problem of depletion. Also, the fluctuation of the threshold voltage due to penetration of boron included in the gate electrode, through the gate oxidation film, can be prevented in the PMOSFET.

This summary of the invention does not necessarily describe essential features so that the invention may also be a sub-combination of these described features.

BRIEF DESCRIPTION OF THE DRAWINGS

FIG. 3A–3E is a sectional view showing processes of a method according to an embodiment of the present invention.

DETAILED DESCRIPTION OF THE PREFERRED EMBODIMENT

Figures 1A, 1B, 1C, 1D, 1E:
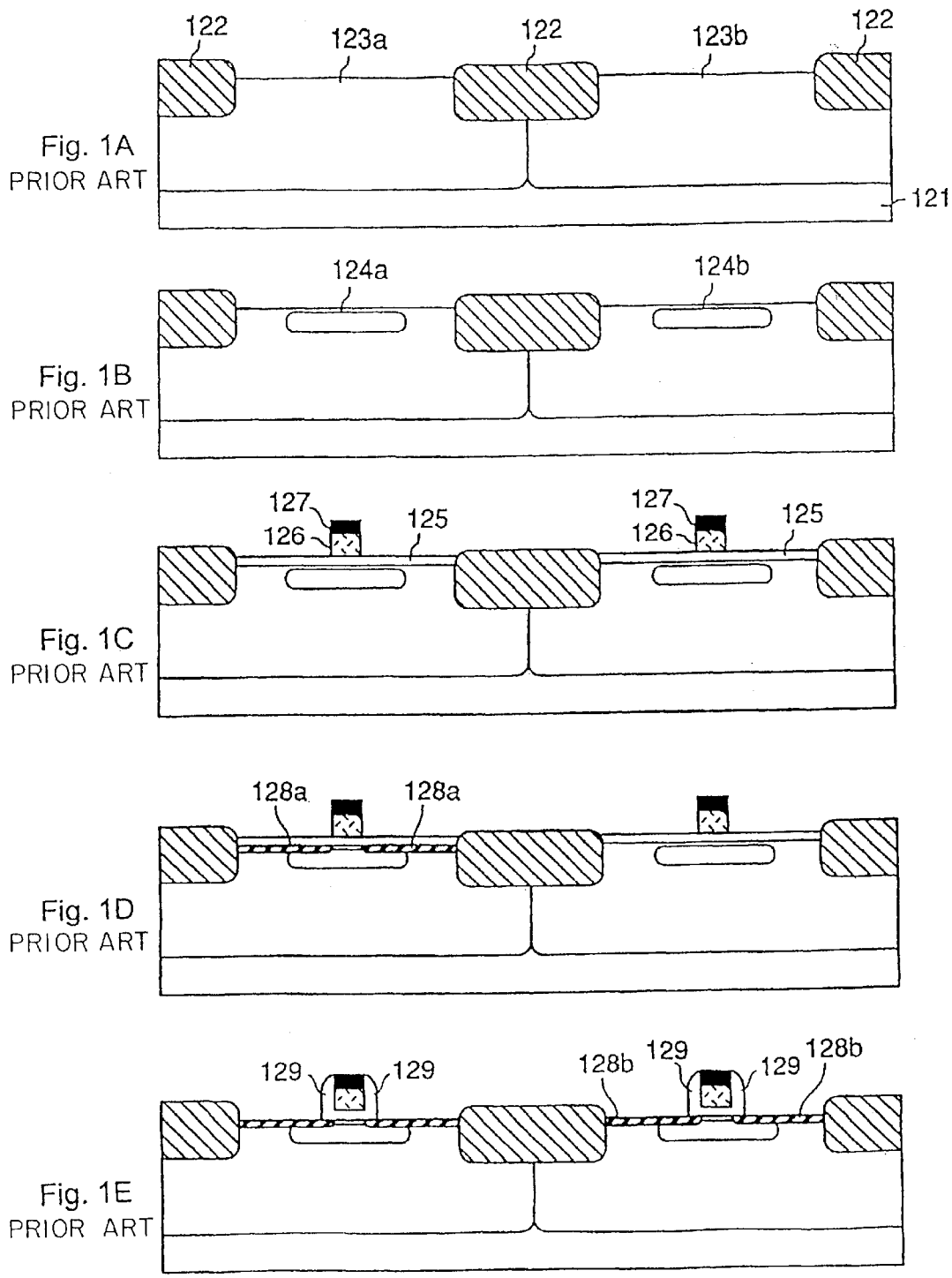
FIG. 1A–1E is a sectional view showing processes of a conventional method.
Figure 2F:
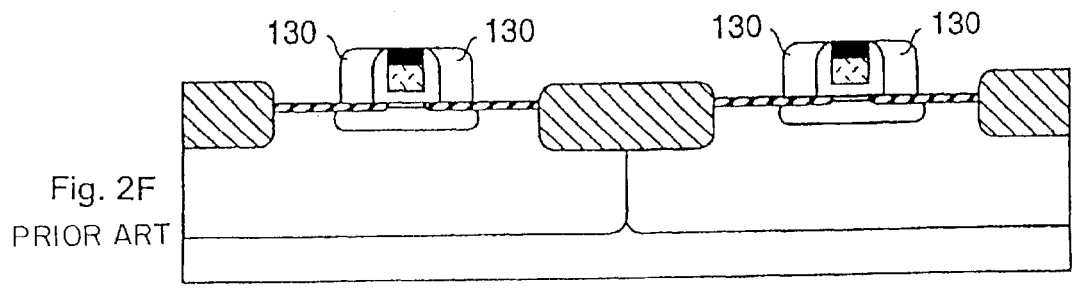
FIG. 2F–2H is a sectional view showing processes of the conventional method that follow the processes shown in FIG. 1.
Figure 2G:
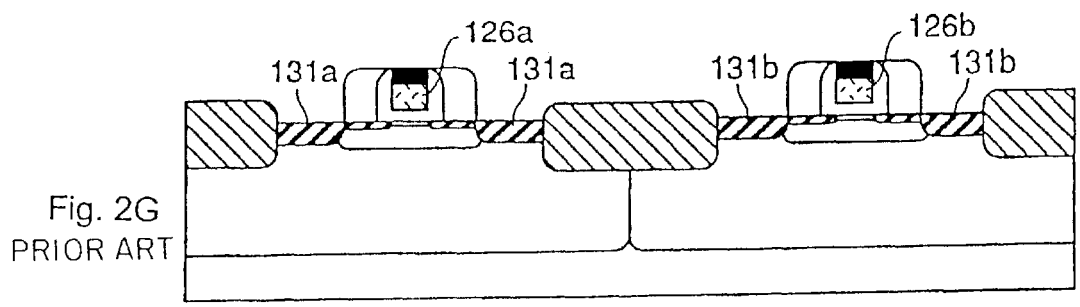
Figure 2H:
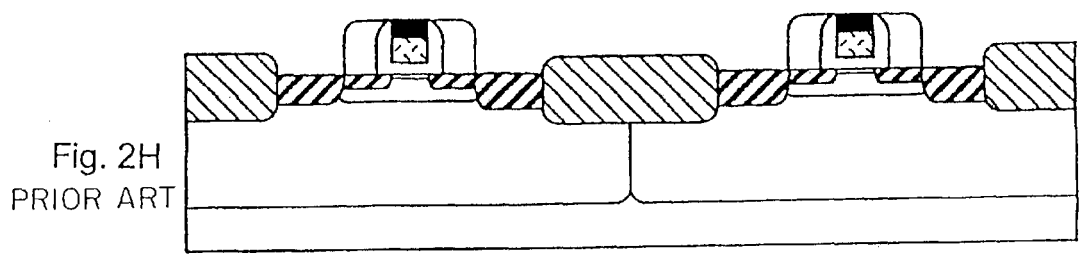

The present invention will now be described based on a preferred embodiment. This does not intend to limit the scope of the present invention, but rather to exemplify the invention. All of the features and combinations thereof described in the embodiment are not necessarily essential to the invention.

The present invention aims to provide a fabrication method for easily fabricating a dual-gate CMOSFET having a satisfactory performance and high precision, at a cost appropriate for industrial mass-production.

It should be noted that only examples of impurities, the dosage thereof, the temperature and the duration of annealing are described, and these parameters can be modified in accordance with the summary of the present invention.

FIGS. 3A–3E and 4F–4H are sectional views that schematically show respective processes of the fabrication method of the dual-gate CMOSFET according to an embodiment of the present invention. The left side of FIGS. 3A–3E and 4F–4H corresponds to an NMOSFET while the right side corresponds to a PMOSFET.

According to the present invention, firstly, a recessed LOCOS (Local Oxidation of Silicon) film 22 with a thickness of 750 nm is formed on a silicon substrate 21 using a known method as in the conventional method. A P well 23a and an N well 23b are then re formed using a high-energy ion implantation apparatus.

In this embodiment, the P well 23a is formed by introducing boron (B) of $1 \geq 10^{13}$ cm$^{-2}$ with 400 keV, while the N well 23b is formed by implanting phosphorus (P) of $1 \geq 10^{13}$ cm$^{-2}$ with 900 keV (FIG. 3A).

Next, a resist pattern (not shown) to be used as a mask for defining an ion implantation region is formed. Using the resist pattern as the mask, punchthrough suppression implantation for suppressing the short channel effect and channel implantation for controlling a threshold voltage are performed by ion implantation, in regions 24a, 24b that are to be positioned under gates.

In the punchthrough suppression implantation and the channel implantation for the P well, boron (B) of $4 \geq 10^{12}$ cm$^{-2}$ and boron fluoride (BF$_2$) of $1 \geq 10^{13}$ cm$^{-2}$ are introduced into the region 24a with 45 keV and 90 keV, respectively.

In the punchthrough suppression implantation and the channel implantation for the N well, phosphorus (P) of $4 \geq 10^{12}$ cm$^{-2}$ and arsenic (As) of $1 \geq 10^{13}$ cm$^{-2}$ are introduced into the region 24b with 120 keV and 100 keV, respectively (FIG. 3B).

A gate oxidation film 25 is then formed with a thickness of 4 nm, in a furnace at 800° C. On the gate oxidation film 25, a polysilicon film 26 having a thickness of 200 nm and a silicon nitride film 27 having a thickness of 100 nm are deposited by LPCVD, and thereafter a resist pattern (not shown) to be used as a mask for patterning gate electrodes is formed. Using the resist pattern as the mask, unnecessary portions of the polysilicon film 26 and the silicon nitride film 27 are etched away, so that polysilicon gate electrodes 26, each having a gate length of about 0.1 μm are formed (FIG. 3C).

After formation of the polysilicon gate electrodes 26, a resist pattern is formed (not shown) for preventing ions from implanting into undesired portions. Using the resist pattern as the mask, arsenic (As) of $1 \geq 10^{15}$ cm$^{-2}$ is introduced with 5 keV, to form a shallow junction source and drain (S/D) 28a of an NMOSFET (FIG. 3D).

Next, a SiO$_2$ film having a thickness of 30 nm is deposited using TEOS by CVD and thereafter the SiO$_2$ film is etched back by reactive ion etching (RIE) to form first side walls 29. A resist pattern (not shown) for preventing ions from implanting into undesired portions is then formed. Using the resist pattern as the mask, boron fluoride (BF$_2$) of $5 \geq 10^{14}$ cm$^{-2}$ is introduced with 5 keV by ion implantation, so that a shallow junction source and drain (S/D) 28b of a PMOSFET are formed (FIG. 3E).

Figure 4F:
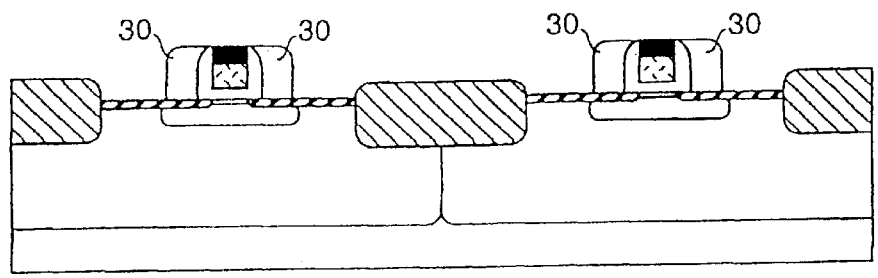
FIG. 4F–4H is a sectional view showing processes of the method according to the embodiment of the present invention, that follow the processes shown in FIG. 3.

After a SiO$_2$ film having a thickness of 200 nm is deposited using TEOS by CVD, the SiO$_2$ film is then etched back by reactive ion etching (RIE) to form second side walls 30 (FIG. 4F).

Next, a resist pattern (not shown) for preventing ions from implanting into undesired portions is formed. Using this resist pattern as the mask, As of $5 \geq 10^{15}$ cm$^{-2}$ is introduced with 20 keV by ion implantation, so that a deep junction source and drain (S/D) 31a of the NMOSFET is formed. Simultaneously, As is also introduced into the polysilicon gate electrode 26, thus the gate electrode 26a of N$^+$ polysilicon is obtained.

Figure 4G:
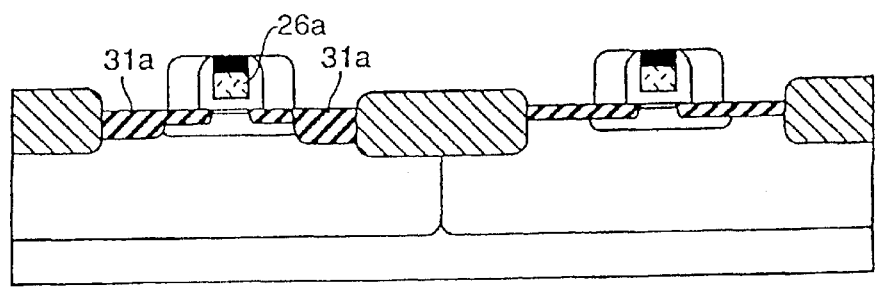

Subsequently, an annealing process is performed using a rapid annealing apparatus (RTA) at a temperature of 1050° C. for 10 seconds, in order to activate the deep junction S/D 31a of the NMOSFET and the gate electrode 26a. By performing the annealing process at a temperature of 1050° C., As in N30 polysilicon is activated sufficiently, eliminating the problem of depletion (FIG. 4G).

Next, similar to the NMOSFET, a resist pattern (not shown) for preventing ions from implanting into undesired portions is formed. Using this resist pattern as the mask, BF$_2$ of $5 \geq 10^{15}$ cm$^{-2}$ is introduced with 10 keV by ion implantation, so that a deep junction source and drain (S/D) 31b of the PMOSFET is formed. Simultaneously, BF$_2$ is also introduced into the polysilicon gate electrode 26, thus the gate electrode 26b of P30 polysilicon is obtained.

Figure 4H:
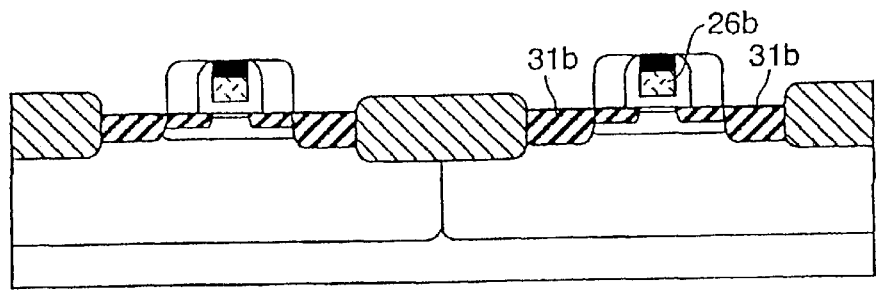

Subsequently, the annealing process is performed using a rapid annealing apparatus (RTA) at a temperature of 1000° C. for 10 seconds, in order to activate the deep junction S/D 31b of the PMOSFET and the gate electrode 26b. Although BF$_2$ is introduced into the gate electrode, the penetration of boron (B) cannot occur because the annealing process is performed at 1000° C. Moreover, the annealing process at 1000° C. does not cause the depletion of the gate electrode in the case of the P30 polysilicon gate into which boron is introduced. By performing the above-mentioned processes, a dual-gate CMOSFET having a fine gate length is fabricated (FIG. 4H).

Figures 5A, 5B:
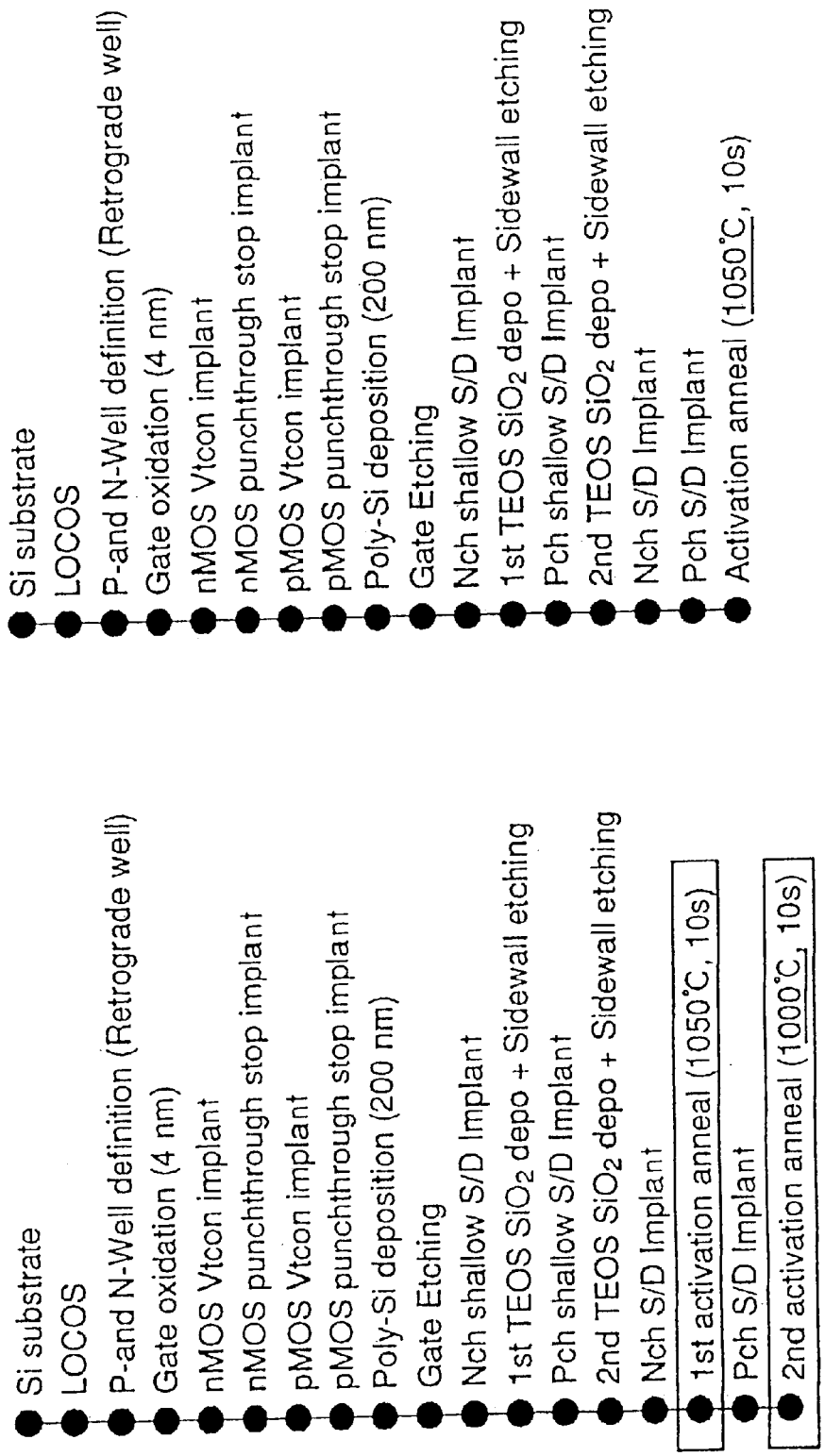
FIG. 5A–5B are respective diagrams for comparison of the flow of the processes according to the present invention and that of the conventional method.

FIG. 5 shows a comparison of the process flow in the fabrication method of the dual-gate CMOSFET according to the embodiment of the present invention and that in the conventional fabrication method. It is noted that a photolithography process is omitted in FIG. 5.

The main differences between the conversional fabrication method and the method according to the embodiment of the present invention are that the annealing for activation, performed for 10 seconds at a temperature of 1050° C., is undertaken after the implantation, for forming the deep junction S/D of the NMOSFET; and that the temperature of the annealing process for activation performed after the implantation, for forming the deep junction S/D of the PMOSFET, decreases from 1050° C. to 1000° C.

As described above, in accordance with the above-mentioned fabrication method of the dual-gate CMOSFET of the present invention, the annealing process for activation is performed at a temperature of 1050° C. or higher after ion implantation, for forming the deep junction S/D of the NMOSFET, and thereafter the annealing process for activation is performed at a lower temperature of 1000° C. or lower after ion implantation, for forming the deep junction S/D of the PMOSFET. Therefore, As in the gate electrode of N$^+$ polysilicon of the NMOSFET is activated sufficiently, thus preventing the problem of depletion. Also, the fluctuation of the threshold voltage because of the penetration of boron included in the gate electrode through the gate oxidation film, can be prevented in the PMOSFET.

Moreover, the present invention provides another benefit, as the dual-gate CMOSFET having the desired characteristics can be fabricated at a low cost without the use of new apparatus, although the additional annealing process is required.

In the above-described method, the shallow junction sources and drains of the NMOSFET and the PMOSFET are subjected to the annealing process twice, at 1050° C. and 1000° C., respectively. Thus, there arises a concern about the increase of overlapped areas (ΔL) of the gate and the source and drain. However, because the distribution factor of As is small, ΔL in the NMOSFET does not greatly increase. Also, ΔL in the PMOSFET does not greatly increase because ΔL can be controlled by adjusting the thickness of the first side wall, although the distribution factor of B is large. Therefore, the adverse effect on the short channel effect, of the annealing process being performed twice, is so small that it can be ignored. In addition, the problem of the depth of the junction becoming too deep can be prevented.

What is claimed is:

1. A fabrication method for fabricating a dual-gate CMOSFET on a semiconductor substrate, comprising:

forming first sidewalls over a first region on the semiconductor substrate where an NMOSFET having symmetrical source and drain regions is to be formed;

forming second sidewalls over a second region on the semiconductor substrate where a PMOSFET having symmetrical source and drain regions is to be formed;

masking the second region including the second sidewalls, and implanting ions of N-type impurity for forming a deep junction symmetrical source and drain in the first region on the semiconductor substrate;

performing a first annealing process for activating said N-type impurity;

masking the first region including the first sidewalls, and implanting ions of P-type impurity for forming a deep junction symmetrical source and drain in the second region on the semiconductor substrate; and performing a second annealing process for activating said P-type impurity;

wherein said first and second annealing processes are performed in the presence of said first and second sidewalls.

2. The fabrication method of claim 1, wherein the first annealing process is performed using a rapid anneal apparatus at a temperature of 1050° C. or higher.

3. The fabrication method of claim 1, wherein the second annealing process is performed using a rapid anneal apparatus at a temperature of 1000° C. or lower.

4. A fabrication method of a dual-gate CMOSFET having a symmetrical source/drain, comprising:

providing a semiconductor substrate having a P-well region and an N-well region;

forming a gate oxide layer over the P-well region and an N-well region of the semiconductor substrate, and forming a polysilicon gate electrode over the gate oxide layer;

implanting ions into the N-well region to form N-type shallow source and drain regions in the N-well region;

forming first sidewalls;

implanting ions into the P-well region to form P-type shallow source and drain regions in the P-well region;

forming second sidewalls;

implanting ions into the P-well region and performing a first annealing to form N-type deep source and drain regions in the P-well region; and implanting ions into the N-well region and performing a second annealing to form P-type deep source and drain regions in the N-well region.

* * * * *